United States Patent
Tuma et al.

(10) Patent No.: US 7,360,581 B2
(45) Date of Patent: Apr. 22, 2008

(54) STRUCTURED THERMAL TRANSFER ARTICLE

(75) Inventors: Phillip E. Tuma, Faribault, MN (US); Gary M. Palmgren, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 193 days.

(21) Appl. No.: 11/268,139

(22) Filed: Nov. 7, 2005

(65) Prior Publication Data

US 2007/0102140 A1   May 10, 2007

(51) Int. Cl.
  *F28F 7/02*  (2006.01)
(52) U.S. Cl. ............................. 165/80.3; 165/185
(58) Field of Classification Search ...... 165/80.2–80.5, 165/185; 257/720, 722; 428/323
   See application file for complete search history.

(56) References Cited

U.S. PATENT DOCUMENTS

| | | |
|---|---|---|
| 3,384,154 A | 5/1968 | Milton |
| 3,523,577 A | 8/1970 | Milton |
| 3,587,730 A | 6/1971 | Milton |
| 3,689,346 A | 9/1972 | Rowland |
| 3,753,757 A | 8/1973 | Rodgers et al. |
| 3,821,018 A | 6/1974 | Grant |
| 3,990,862 A | 11/1976 | Dahl et al. |
| 4,064,914 A | 12/1977 | Grant |
| 4,129,181 A | 12/1978 | Janowski et al. |
| 4,182,412 A | 1/1980 | Shum |
| 4,232,056 A | 11/1980 | Grant et al. |
| 4,354,550 A | 10/1982 | Modahl et al. |
| 4,381,818 A | 5/1983 | Sachar et al. |
| 4,663,243 A | 5/1987 | Czikk et al. |
| 4,890,669 A | 1/1990 | Zohler |
| 5,570,502 A * | 11/1996 | Sawtell et al. ............. 29/527.6 |
| 5,814,392 A | 9/1998 | You et al. |
| 6,397,450 B1 | 6/2002 | Ozmat |
| 6,896,039 B2 | 5/2005 | Dussinger et al. |
| 7,109,581 B2 * | 9/2006 | Dangelo et al. ............. 257/720 |
| 7,124,809 B2 * | 10/2006 | Rosenfeld et al. ...... 165/104.26 |
| 2002/0192488 A1 * | 12/2002 | Kurihara et al. ............ 428/621 |
| 2004/0003619 A1 | 1/2004 | Lee et al. |
| 2004/0186203 A1 | 9/2004 | Koyanagi |
| 2005/0095189 A1 | 5/2005 | Brey et al. |
| 2007/0035927 A1 * | 2/2007 | Erturk et al. ................ 361/700 |

FOREIGN PATENT DOCUMENTS

| | | |
|---|---|---|
| EP | 0 786 506 A1 | 7/1997 |
| JP | 57-164292 | 3/1984 |

(Continued)

OTHER PUBLICATIONS

Encyclopedia of Polymer Science and Technology, vol. 8, John Wiley & Sons, Inc. (1968) p. 651-665.

*Primary Examiner*—Teresa J. Walberg
(74) *Attorney, Agent, or Firm*—Daniel D. Biesterveld; James A. Baker

(57) ABSTRACT

Structured thermal transfer article comprising a plurality of metal bodies and a plurality of interstitial elements disposed between and connecting the plurality of metal bodies to one another. The metal bodies comprise an inner portion comprising a first metal and an outer portion comprising an alloy comprising the first metal and a second metal. The interstitial elements comprise the alloy of the outer portion.

32 Claims, 3 Drawing Sheets

FOREIGN PATENT DOCUMENTS

| | | |
|---|---|---|
| JP | 61-273253 | 12/1986 |
| JP | 10-62096 | 3/1998 |
| JP | 2004-300415 | 10/2004 |
| KR | 10-1999-0050184 | 7/1999 |
| KR | 10-2004-0005108 | 1/2004 |
| WO | WO 94/10294 | 1/1994 |

* cited by examiner

STRUCTURED THERMAL TRANSFER ARTICLE

FIELD OF INVENTION

The present invention relates generally to a structured thermal transfer article. More particularly, the present invention relates to a shaped porous metallic articles and methods of making and using the same.

BACKGROUND

One cooling system for heat-dissipating components comprises fluids that evaporate or boil. The vapor produced is then condensed using external means and returned back to the boiler. To improve heat transfer of the fluid at the boiler, a porous boiling surface can be used.

A variety of porous boiling surfaces are available, including, for example, coatings made by flame or plasma spraying. With these processes, it can be difficult to control porosity and evenly coat three-dimensional substrates. Other known coatings comprise conductive particles joined with organic binders. These coatings generally have poor bulk thermal conductivity and therefore require precise thickness control that is difficult on substrates with three-dimensional surfaces.

As integrated circuits and other heat dissipating electronic devices become more powerful and compact, the rate of heat transfer away from these heat-dissipating components needs to be increased. Accordingly, there is a continuing need to develop porous boilers with high heat transfer coefficients. Further, there is a continuing need for inexpensive porous boilers that can be easily applied in a manufacturing process.

SUMMARY

The present invention relates generally to a structured thermal transfer article. More particularly, the present invention relates to porous metallic articles and methods of making and using the same. The articles can be used to as evaporators for cooling devices such as refrigeration systems and electronic cooling systems. The structured thermal transfer articles can be used in both single or two phase heat transfer systems. In some embodiments, the article is used as a boiler in a thermosyphon used to cool an integrated circuit such as, for example, a microprocessor.

In one aspect, the present disclosure provides a structured thermal transfer article comprising a plurality of metal bodies and a plurality of interstitial elements disposed between and connecting the plurality of metal bodies to one another. The metal bodies comprise an inner portion comprising a first metal selected from the group consisting of aluminum, copper, silver, and alloys thereof, and an outer portion comprising an alloy comprising the first metal and a second metal selected from the group consisting of copper, silver, and magnesium. The interstitial elements comprise the alloy of the outer portion.

In some embodiments, the first metal comprises copper, the second metal comprises silver, and the interstitial elements comprise an alloy of silver and copper. In other embodiments, the first metal comprises aluminum, the second metal comprises magnesium, and the interstitial elements comprise an alloy of aluminum and magnesium.

In one aspect, the present disclosure provides a structured thermal transfer article comprising a plurality of metal bodies and a plurality of interstitial elements disposed between and connecting the plurality of metal bodies to one another. The metal bodies comprise an inner portion comprising a first metal selected from the group consisting of aluminum, copper, silver, and alloys thereof, and an outer portion comprising an alloy comprising the first metal and a second metal selected from the group consisting of copper, silver, and magnesium. The metal bodies comprise diamond in their inner portion. In addition to the first metal, the diamonds can be coated with an intermediate coating comprising a carbide former selected from the group consisting of chromium, cobalt, manganese, molybdenum, nickel, silicon, tantalum, titanium, tungsten, vanadium, zirconium, and alloys thereof. The interstitial elements comprise the alloy of the outer portion.

In another aspect, the present disclosure provides methods for forming structured thermal transfer articles. The methods include providing a production tool having a predetermined array of mold cavities and depositing a composition comprising a binder and a plurality of metal bodies onto the production the tool. The metal bodies comprise an inner portion comprising a first metal having a melting temperature $T_{mp1}$, and an outer portion comprising a second metal having a melting temperature $T_{mp2}$. The composition is then heated to a temperature less than $T_{mp1}$ and $T_{mp2}$ to form an alloy comprising the first metal and the second metal that bonds said plurality of metal bodies to one another and the heat-dissipating substrate. This process is referred to as isothermal re-solidification.

In another aspect, methods for cooling heat-dissipating devices using structured thermal transfer articles of the present disclosure are provided.

In the context of the present disclosure:

The term "effective porosity" refers to the interconnected pore volume or void space in a body that contributes to fluid flow or permeability in a matrix. Effective porosity excludes isolated pores that may exist in the matrix. The effective porosity of a structured thermal transfer article of the present disclosure is measured exclusive of non-porous substrates or other non-porous layers that may form part of the structured thermal transfer article.

The term "unit density" refers to the quantity of designated units per a specified volume. For example, if a porous matrix as described in the present disclosure comprises 100 metal bodies and occupied a volume of 1 cubic centimeter, the unit density of the metal bodies would be 100 metal bodies per cubic centimeter The term "aspect ratio" refers to the ratio of the longest dimension of a three-dimensional body (i.e., "overall length") and the longest dimension orthogonal to the overall length dimension (i.e., "overall width").

The term "substantially spherical" refers to three-dimensional body having an aspect ratio between about 1 and 1.5 and a generally spherical shape.

The term "precisely shaped thermal transfer composite" refers to a thermal transfer composite having a molded shape that is approximately the inverse of the mold cavity that is used to form the molded shape.

The term "structured thermal transfer article" refers to a thermal transfer article comprising a plurality of three-dimensionally shaped thermal transfer composites.

The above summary of the present disclosure is not intended to describe each disclosed embodiment of every implementation of the structured thermal transfer article of the present disclosure. The Figures and the detailed description that follow more particularly exemplify illustrative embodiments. The recitation of numerical ranges by endpoints includes all numbers subsumed with that range (e.g., 1 to 5 includes 1, 1.5, 2, 2.75, 3, 4, 4.80, and 5).

These figures, which are idealized, are not to scale and are intended to be merely illustrative of the present the structured thermal transfer article of the present disclosure and are non-limiting.

DETAILED DESCRIPTION

Figure 1:
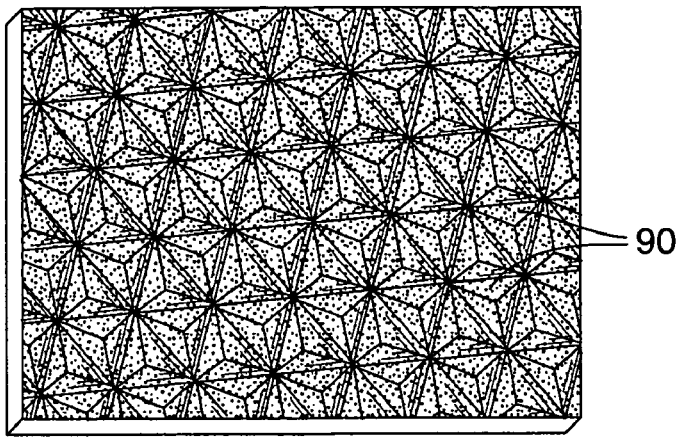
FIG. 1 is a perspective view of a structured thermal transfer article of the present disclosure.

FIG. 1 is a perspective view of a structured thermal transfer article 10 of the present disclosure. As shown in FIG. 1, the structured thermal transfer article 10 comprises a plurality of shaped thermal transfer composites 90. The thermal transfer composites comprise a plurality of metal bodies connected to one another with interstitial elements.

Figure 2A:
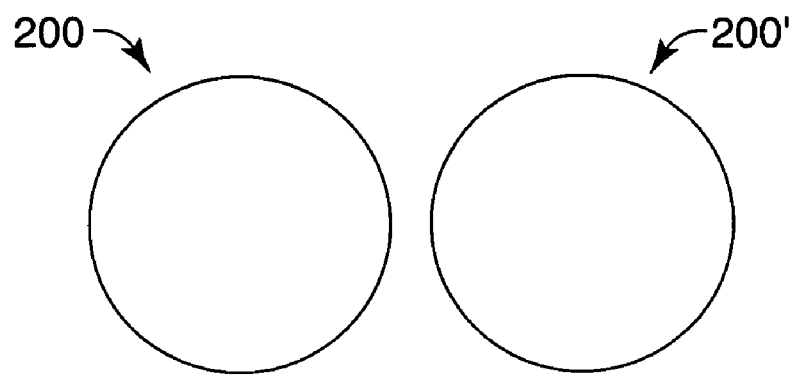
FIG. 2A is a side view of two exemplary precursor metal bodies used to make structured thermal transfer articles of the present disclosure.
Figure 2B:
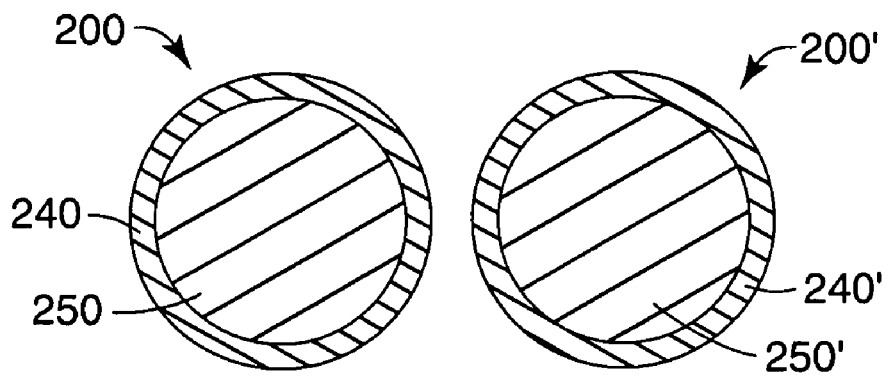
FIG. 2B is a cross-sectional view of the two exemplary precursor metal bodies shown in FIG. 2A.
Figure 2C:
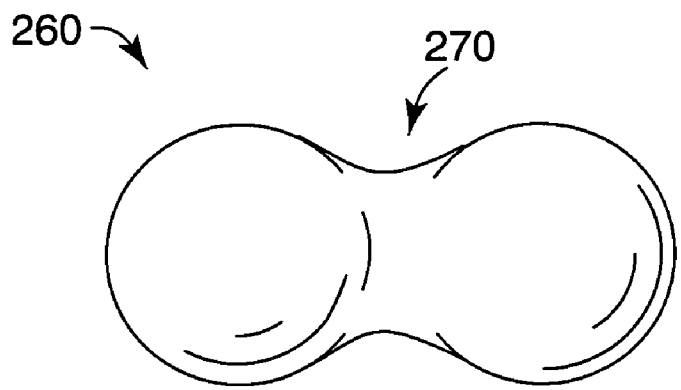
FIG. 2C is a side view of the two exemplary metal bodies shown in FIG. 2A after an interstitial element is formed to attach the two bodies together using methods of the structured thermal transfer article of the present disclosure.

FIGS. 2A-2C illustrate the sequence by which the structured thermal transfer article of the present disclosure is formed. The figures are a simplified representation showing two exemplary precursor metal bodies being joined. The structured thermal transfer articles of the present disclosure typically are formed from large numbers of precursor metal bodies that join together in a three-dimensional porous matrix.

FIG. 2A is a side view of two exemplary precursor metal bodies used to make structured thermal transfer articles of the present disclosure. As shown in FIG. 2A, the precursor metal bodies 200, 200' can be about the same size. In other embodiments, the precursor metal bodies can vary in size. The precursor metal bodies can be substantially spherical as shown in FIG. 2A.

The precursor metal bodies that are useful for making coatings in accordance with the present disclosure typically have an average diameter of at least 1 micrometer. In some embodiments, the precursor metal bodies have an average diameter of at least 5 micrometers. In yet further embodiments, the precursor metal bodies have an average diameter of at least 10 micrometers.

The precursor metal bodies that are useful for making coatings in accordance with the present disclosure typically have an average diameter no greater than 100 micrometers. In some embodiments, the precursor metal bodies have an average diameter no greater than 50 micrometers. In yet further embodiments, the precursor metal bodies have an average diameter no greater than 30 micrometers.

Some embodiments use precursor metal bodies having an aspect ratio in the range of 1 to 2. In other embodiments, the precursor metal bodies are oval shaped and have an aspect ratio greater than 1.5. In yet further embodiments, the precursor metal bodies can be polyhedrons (e.g., cubo-octohedral) or other randomly shaped bodies, including, for example, flake, chip, fiber, plate, cylinder, and needle-shaped bodies. If the precursor metal bodies are non-spherical, the "diameter" of the body refers to the dimension of the smallest axis in each body, and the "average diameter" refers to the average of the individual body diameters (i.e., dimension of smallest axis in each body) in the population.

FIG. 2B is a cross-sectional view of the two exemplary precursor metal bodies 200, 200' shown in FIG. 2A. As shown in FIG. 2B, each precursor metal body comprises an inner portion 250, 250', and an outer portion 240, 240'. In some embodiments, the inner portion 250, 250' comprises a metal selected from the group consisting of aluminum, copper, silver, and alloys thereof. In some embodiments, the outer portion 240, 240' comprises a metal selected from the group consisting of copper, silver, magnesium, and alloys thereof. In yet further embodiments, the inner portion has a metal having a melting temperature $T_{mp1}$, the outer portion has a metal having a melting temperature $T_{mp2}$, and upon heating to a temperature less than $T_{mp1}$ or $T_{mp2}$, an alloy is formed comprising the metals of the inner and outer portions. In some embodiments, the metals in the inner and outer portion of the precursor metal bodies are selected based upon their thermal conductivity and/or their alloy forming characteristics.

In some embodiments, the outer portion is uniformly applied to the inner portion such that the outer portion has a uniform thickness. In other embodiments, the thickness of the outer coating can vary. In some preferred embodiments, the outer portion covers a majority of the outer surface of the inner portion. In some embodiments, the outer portion covers more than 90 percent of the outer surface of the inner portion. In yet further embodiments, the outer portion covers the outer surface of the inner portion completely.

The amount of material used to form the outer portion can be expressed in terms of relative weight or thickness. For example, in some embodiments, the outer portion comprises about 10 percent by weight of the metal body precursor. The outer portion typically comprises between about 0.05 and 30 percent by weight of the metal body precursor. In other embodiments, the outer portion has an average thickness in the ranges of 0.001 to 0.5 micrometers. In some embodiments, the outer portion has an average thickness in the range of 0.01 to 0.05 micrometers.

An exemplary useful precursor metal body having a copper inner portion and silver outer portion is available as "SILVER COATED COPPER POWDER #107" from Ferro Corp. (Plainfield, N.J.). Other useful precursor metal bodies include, for example, aluminum particles coated with magnesium. The precursor metal bodies can be formed using any methods known to those in the art, including, for example, physical vapor deposition (see, e.g., U.S. Pat. App. Pub. 2005/0095189 A1 (Brey et al.)), plasma deposition, electroless plating, electrolytic plating, or immersion plating.

FIG. 2C is a side view of the two exemplary precursor metal bodies 200, 200' shown in FIGS. 2A and 2B joined together to form structure 260. As shown in FIG. 2C, an interstitial element 270 is formed to attach the two bodies together using methods of the present disclosure. The interstitial element 270 is formed by subjecting the precursor metal bodies to an elevated temperature such that the metals of the inner and outer portions of the precursor metal bodies form an alloy that bonds the bodies together. This process is known as isothermal re-solidification. In some embodiments, a eutectic is formed that has a lower melting point than the individual metals that form the alloy. The formation of the eutectic may be temporary as diffusion during the isothermal re-solidification process can cause continuous change in the composition of the interfaces of the various metals. In some embodiments, the isothermal re-solidification process occurs in a reducing or vacuum furnace, such as, for example, a VCT model vacuum furnace available from Hayes of Cranston, R.I.

Figure 5:
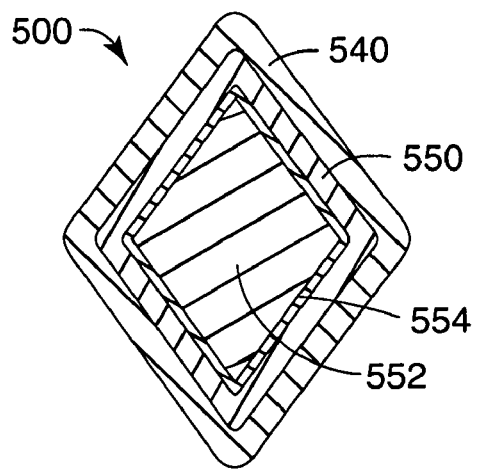
FIG. 5 is a cross-sectional view of an exemplary precursor composite body comprising a coated diamond.

FIG. 5 is a cross-sectional view of an exemplary precursor metal body comprising a coated diamond in the inner portion. As shown in FIG. 5, the inner portion of the precursor metal body comprises a diamond 552, an intermediate coating 554, and the first metal 550. The outer portion 540 comprises the second metal. The intermediate coating that coats the diamond can comprise any known carbide former, including, for example, chromium, cobalt, manganese, molybdenum, nickel, silicon, tantalum, titanium, tungsten, vanadium, zirconium, and alloys thereof. The intermediate coating can be applied to the diamond using any techniques known in the art, including, for example, physical vapor deposition, chemical vapor deposition, molten salt deposition (see, e.g., EP 0 786 506 A1 (Karas et al.)), electrolysis in molten salt, and mechanical plating. In some embodiments, the intermediate coating that coats the diamond comprises multiple layers.

Although not wishing to be bound by any theory, the thermal conductivity of the encapsulated diamonds is believed to enhance the performance of the structured thermal transfer article. In some embodiments, diamonds (coated or uncoated) can be combined with the plurality of precursor metal bodies (with or without internal diamonds) to form a structured thermal transfer article having a mixture of metal bodies and diamonds held together with interstitial elements. Other materials can also be encapsulated or combined with the metal bodies, including, for example, polycrystalline diamonds, synthetic diamond, polycrystalline diamond compacts (PDC), isotopically pure diamond, and combinations thereof.

As discussed above, FIGS. 2A-2C are a simplified representation showing two exemplary precursor metal bodies being joined. The structured thermal transfer articles of the present disclosure typically are formed from large numbers of precursor metal bodies that join together in a three-dimensional porous matrix. Each of the metal precursor metal bodies can join to 1, 2, 3, 4, 5, or more other metal precursor metal bodies to form the three-dimensional porous matrix.

Figure 3:
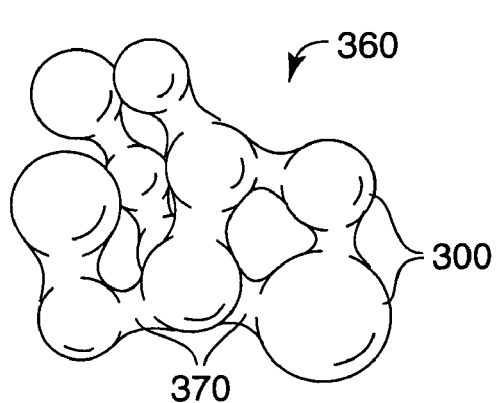
FIG. 3 is an exemplary perspective view of a portion of an exemplary structured thermal transfer article of the present disclosure.

FIG. 3 is an exemplary perspective view of a portion of an exemplary structured thermal transfer article of the present disclosure. As shown in FIG. 3, the structured thermal transfer article 360 comprises a plurality of metal bodies 300 connected to one another with interstitial elements 370 to form a three-dimensional porous matrix. The interstitial elements 370 can also bond a metal body 300 to a substrate.

In some embodiments, the structured thermal transfer article of the present disclosure has a metal body density in the range of about $10^6$ to $10^{11}$ metal bodies per cubic centimeter. In some embodiments, the structured thermal transfer article of the present disclosure has a metal body density in the range of about $10^7$ to $10^9$ metal bodies per cubic centimeter.

The porosity of the structured thermal transfer article of the present disclosure is typically in the range of 10 to 60 percent. In some embodiments, the porosity of the structured thermal transfer article is at least 20 percent. In yet further embodiments, the porosity of the structured thermal transfer article is at least 30 percent.

Figure 4:
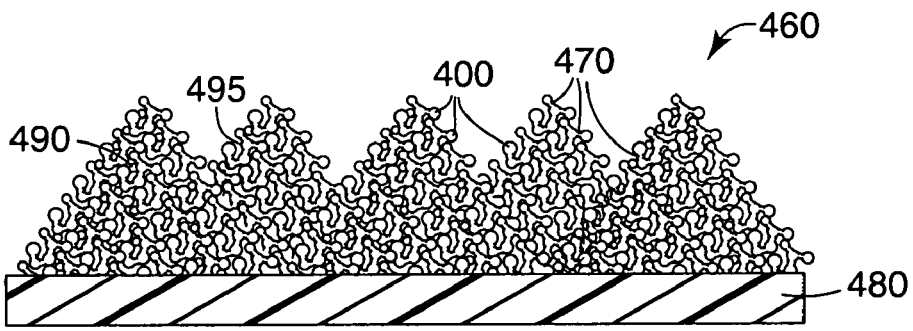
FIG. 4 is an exemplary cross-sectional side view of a portion of an exemplary structured thermal transfer article of the present disclosure.

FIG. 4 is an exemplary cross-sectional side view of a portion of an exemplary structured thermal transfer article 460 of the present disclosure. As shown in FIG. 4, the structured thermal transfer article 460 comprises a plurality of precisely shaped thermal transfer composites 490, 495, each having a pyramid shape, affixed to an optional substrate 480. The cross-sectional view of composite 490 partially blocks out the view of the lower portion of composite 495, which is located behind composite 490. It should be understood, however, that composites 490 and 495 have similar shapes and dimensions. The composites comprise a plurality of metal bodies 400 connected to one another with interstitial elements 470.

The precursor metal bodies can be arranged using any known techniques for positioning bodies to fabricate three-dimensional porous matrices, including, for example, gravity, molds, and binders (e.g., thermally removable binders). In some embodiments, a thin layer of precursor metal bodies is placed on a substantially level surface and heated to form the structured thermal transfer article. In other embodiments, a perimeter wall (i.e., mold) can be used to retain the precursor metal bodies prior to and during the isothermal re-solidification step. In yet further embodiments, a temporary binder is used to position the precursor metal bodies prior to and during the isothermal re-solidification step.

The binder can be any known binder that sufficiently adheres the precursor metal bodies together prior to and during isothermal re-solidification process. Useful binders include mineral oil, silicone oil, kerosene, and polyvinyl butyral. In some preferred embodiments, the binder burns off during the re-solidification process and is substantially removed from the resulting structured thermal transfer article. The binder may be selected to form a slurry having a paste-like consistency. In some embodiments, the binder is selected to allow the precursor metal bodies to be positioned on the various planes of a three-dimensional surface, including, for example, vertical planes.

In some embodiments, a mixture of oil available as "DOW CORNING 704 DIFFUSION PUMP FLUID" from Dow-Corning Corp. (Midland, Mich.), and fluid available as "NOVEC ENGINEERED FLUID HFE-72DE" from 3M Co. (St. Paul, Minn.), is used as a binder. The mixture can be sprayed onto a service using, for example, an artist air brush. After applying the mixture, precursor metal bodies can be introduced to the wetted surface. The process can be repeated until the desired thickness is achieved.

As discussed above, the structured thermal transfer article 460 depicts an exemplary embodiment with precisely shaped thermal transfer composites 490, 495. In other embodiments, the thermal transfer composites are not precisely shaped, but are simply three-dimensionally shaped. The three dimensional shapes can be random in shape and/or size, or can be uniform in shape and/or size. In some embodiments, the thermal transfer composites comprise random shapes and sizes formed by dropping varying sized "droplets" of the precursor metal bodies in a binder onto a surface without the use of a mold. The surface can become an integral part of the structured thermal transfer article (i.e., the substrate), or the structured thermal article can be removed from the surface after formation.

In the embodiment depicted in FIG. 4, the structured thermal transfer article 460 has composites 490, 495 affixed to a substrate 480. Substrate 480 is optional. In some embodiments, the substrate is formed of the same metal bodies and interstitial elements used to form the composites 490, 495. In other embodiments, the substrate is formed of a metal. The alloy used to form the interstitial elements can be selected to facilitate attachment of the structured thermal transfer article to a substrate. In some embodiments, the substrate has a metal surface that comprises at least one of the metals used to form the alloy that forms the interstitial elements. In some embodiments, for example, the substrate comprises copper, the inner portion of the precursor metal bodies comprise copper, the outer portion of the precursor metal bodies comprise silver, and the interstitial elements that are formed comprise an alloy of copper and silver wherein at least a portion of the interstitial elements that bond some of the metal bodies to the substrate comprise copper derived from the substrate.

Figure 6:
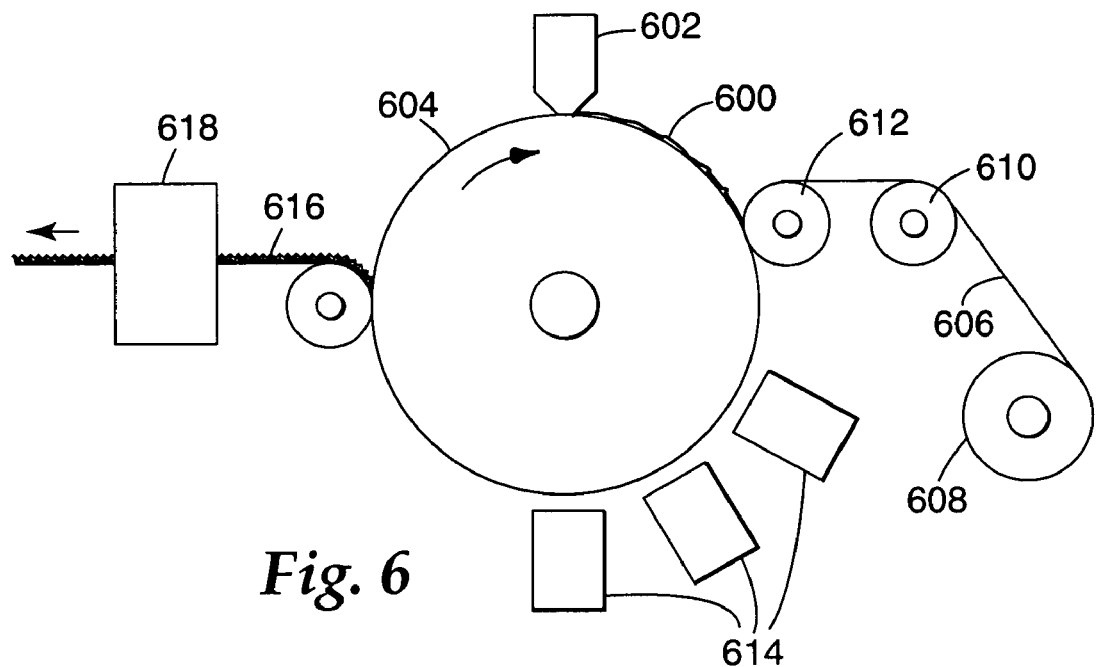
FIG. 6 is a schematic view of an exemplary apparatus for making a structured thermal transfer article of the present disclosure.

FIG. 6 is a schematic view of an exemplary apparatus for making a structured thermal transfer article of the present disclosure. As shown in FIG. 6, a slurry 600 comprising the precursor metal bodies and a binder flows out of a feeding trough 602 by pressure or gravity and onto a production tool 604, filling in cavities (not shown) therein. If slurry 600 does not fully fill the cavities, the resulting structured thermal transfer article will have voids or small imperfections on the surface of the thermal transfer composites and/or in the interior of the thermal transfer composites. Other ways of introducing the slurry to the production tool include die coating and vacuum drop die coating.

The viscosity of the slurry is preferably closely controlled for several reasons. For example, if the viscosity is too high, it will be difficult to apply the slurry to the production tool.

Production tool 604 can be a belt, a sheet, a coating roll, a sleeve mounted on a coating roll, or a die. In some preferred embodiments, the production tool 604 is a coating roll. Typically, a coating roll has a diameter between 25 and 45 centimeters and is constructed of a rigid material, such as metal. Production tool 604, once mounted onto a coating machine, can be powered by a power-driven motor.

Production tool 604 has a predetermined array of at least one specified shape on the surface thereof, which is the inverse of the predetermined array and specified shapes of the thermal transfer composites. Production tools for the process can be prepared from metal, although plastic tools can also be used. A production tool made of metal can be fabricated by engraving, hobbing, assembling as a bundle a plurality of metal parts machined in the desired configuration, or other mechanical means, or by electroforming. These techniques are further described in the Encyclopedia of Polymer Science and Technology, Vol. 8, John Wiley & Sons, Inc. (1968), p. 651-665, and U.S. Pat. No. 3,689,346, column 7, lines 30 to 55, all incorporated herein by reference.

In some instances, a plastic production tool can be replicated from an original tool. The advantage of plastic tools as compared with metal tools is cost. A thermoplastic resin, such as polypropylene, can be embossed onto the metal tool at its melting temperature and then quenched to give a thermoplastic replica of the metal tool. This plastic replica can then be utilized as the production tool.

A substrate 606 departs from an unwind station 108, then passes over an idler roll 610 and a nip roll 612 to gain the appropriate tension. Nip roll 612 also forces backing 606 against slurry 600, thereby causing the slurry to wet out backing 606 to form an intermediate article.

The slurry is dried using energy source 614 before the intermediate article departs from production tool 604. After drying, the specified shapes of the thermal transfer composites do not change substantially after the structured thermal transfer article departs from production tool 604. Thus, the structured thermal transfer article is an inverse replica of production tool 604. The structured thermal transfer article 616 departs from production tool 604 and passes through the isothermal re-solidification oven 618.

The structured thermal transfer article can also be made according to the following method. First, a slurry containing a mixture of a precursor metal bodies and a binder is introduced to a backing having a front side and a back side. The slurry wets the front side of the backing to form an intermediate article. Second, the intermediate article is introduced to a production tool. Third, the slurry is at least partially dried before the intermediate article departs from the outer surface of the production tool. Fourth, the intermediate article is heated to a temperature at which isothermal re-solidification occurs and the structured thermal transfer article is formed. The four steps can be conducted in a continuous manner, thereby providing an efficient method for preparing a structured thermal transfer article. The second method is similar to the first method, except that in the second method the slurry is initially applied to the backing rather than to the production tool.

The thermal transfer composites can have a variety of shapes, including, for example, cubic, cylindrical, prismatic, rectangular, pyramidal, truncated pyramidal, conical, truncated conical, cross, post-like with a flat top surface, hemispherical, and combinations thereof. The thermal transfer composites can vary also vary in size. The thermal transfer composites typically have an average height in the range of 20 to 1,000 micrometers. In some embodiments, the thermal transfer composites have an average height in the range of 50 to 500 micrometers. In some embodiments, a variety of shapes and/or sizes are used to form the thermal transfer composites.

In some preferred embodiments, the structured thermal transfer article comprises a plurality of thermal transfer composites arranged in the form of a pre-determined pattern. At least some of the composites may be precisely shaped abrasive composites. In some embodiments, the composites have substantially the same height. The structured thermal transfer articles typically include at least about 1,200 composites per square centimeter of surface area.

The structured thermal transfer articles of the present disclosure typically have an average thickness in the range of 20 to 1,000 micrometers. In some embodiments, the structured thermal transfer article has an average thickness in the range of 50 to 500 micrometers.

The structured thermal transfer article of the present disclosure can be used in cooling systems, such as, for example, a thermosyphon. The structured thermal transfer article can be applied directly to the heat-generating device or a heat-dissipating device in thermal communication with the heat-generating device.

The structured thermal transfer article of the present disclosure typically have a heat transfer coefficient of at least 3 watts per square centimeter per degree Celsius at a heat flux of at least 10 watts per square centimeter. In some embodiments, the structured thermal transfer article of the present disclosure have a heat transfer coefficient of at least 6 watts per square centimeter per degree Celsius at a heat flux of at least 10 watts per square centimeter.

Advantages and other embodiments of the structured thermal transfer article of the present disclosure are further illustrated by the following examples, but the particular materials and amounts thereof recited in these examples, as well as other conditions and details, should not be construed to unduly limit the structured thermal transfer article of the present disclosure. For example, the metals used to form the precursor metal bodies can vary. All parts and percentages are by weight unless otherwise indicated.

EXAMPLES

Metal Body Precursor Materials

| Identification | Description | Source |
|---|---|---|
| A | Sub 325 Mesh copper particles sputter coated with silver using a process described in U.S. Patent Application Publication 2005/0095189 A1. The resultant particles contained 0.4-0.9 weight percent silver. | #CU-112, Atlantic Equipment Engineers, Bergenfield, NJ Silver available from Academy Precision Materials, Albuquerque, NM |

Structured thermal transfer articles were prepared and boiling experiments were conducted using the methods described below.

Test Methods

Pool Boiling

Substrates for the structured thermal transfer articles were made of 5.8 cm diameter machined copper disks 0.317 cm thick. One surface of these disks contained a 1 millimeter thermocouple groove machined to a depth of about 2 millimeter and terminating at the disk centerline. The central 2.54 cm diameter of the opposite surface was the surface that the porous structure was applied. The metal body precursors were first mixed with diffusion pump oil to create a claylike mixture that was then applied to the masked surface of the test disk. The mixture was then stamped with a polycarbonate mold having an array of cubed corners having about 1 millimeter long sidewalls to create a structured coating.

The structured thermal transfer articles were put into a vacuum furnace. The pressure was reduced to below 0.001 millimeter of mercury while the furnace temperature was raised at about 14 degrees Celsius per minute to 300 degrees Celsius and held at 300 degrees Celsius for 15 minutes to remove the oil. The furnace was then heated to 850 degrees Celsius at about 14 degrees Celsius per minute and then allowed to cool to near room temperature before the vacuum was broken and the part removed.

An apparatus was built to permit rapid testing of many test structured thermal transfer articles. The apparatus comprised a copper pedestal heater with a square copper base 31.8 millimeter by 31.8 millimeter and 3 millimeters high and a round raised region 28.5 millimeter in diameter that projected 3 millimeter from one surface of the square base. The flat surface of the round projection was lapped flat and polished. A 25.4 by 25.4 millimeter Kapton Heater (Minco HK5318 R7.6 L24 E) was attached to the exposed surface of the square case using thermally conductive epoxy (3M Scotch-Weld DP 460-EG All, available from 3M Company, St. Paul, Minn.).

The heater was cast in a silicone rubber compound, which formed a disk of 55 millimeter in diameter and 13 millimeter high. The top surface of the silicone was flush with the lapped surface of the heater. A small thermocouple placed atop the silicone, 2 millimeter from the outer diameter of the copper heater was used to measure the test disk or wall temperature, $T_w$.

To mount a test article, a small quantity of silver grease was first applied to the heater surface. A test structured thermal transfer article was then placed atop the silicone and the greased heater surface such that the disk pressed on the thermocouple. A 28 millimeter inside diameter glass tube bearing a PTFE gasket was clamped atop the test disk sealing to its periphery. About 20 milliliters of 3M NOVEC ENGINEERED FLUID HFE-7000 (available from 3M Company, St. Paul, Minn.) was then added though the open top of the tube. A water-cooled condenser coil was inserted into the top of the tube. A thermocouple in the region between the bottom of the copper coil and the top of the meniscus of the fluid was used to measure the fluid saturation temperature, $T_{sat}$.

An automated data acquisition system applied DC voltage, V, to the heater. The voltage began at 4 VDC and progressed at 2 VDC increments every 3 minutes until the voltage exceeded a preset limit. Each data point was logged before progressing to the next by averaging 100 temperature measurements. The heat flux to the heater, Q", was logged as the average voltage squared divided by the heater resistance at its maximum temperature, R, divided by the area of the coated surface of the test disks:

$$Q'' = \frac{4V^2}{R\pi D^2}$$

The heat transfer coefficient, H, is then calculated as $$H = \frac{Q''}{T_w - T_{sat}}$$

Figure 7:
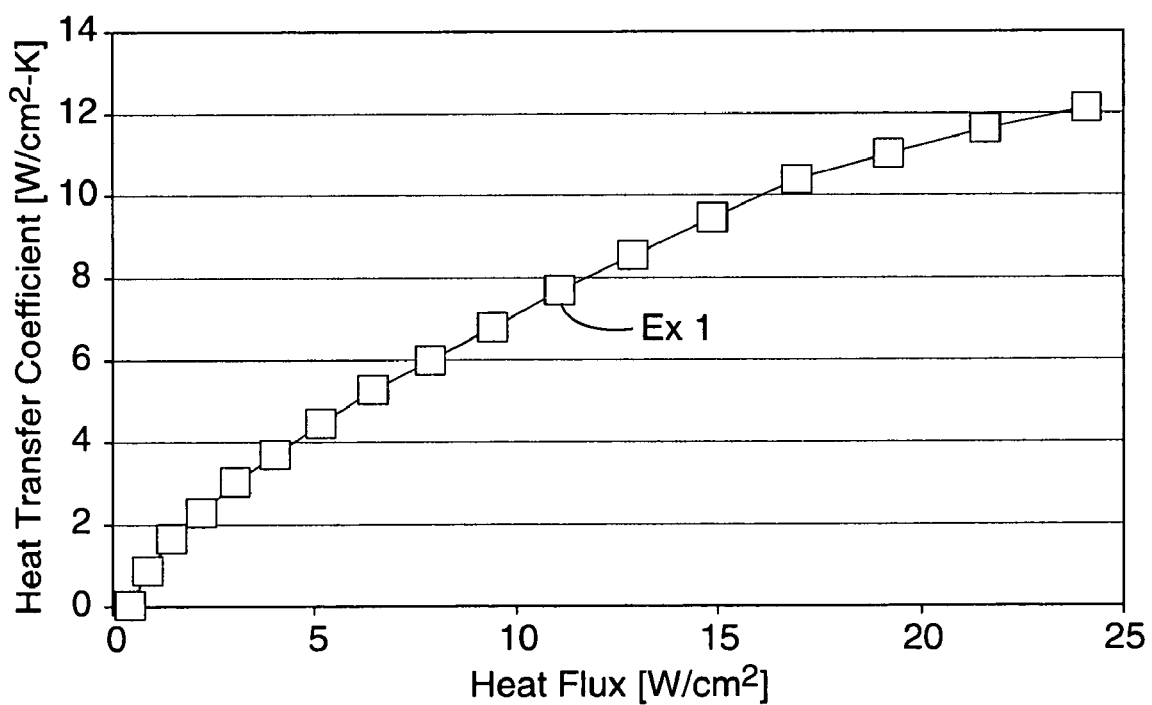
FIG. 7 is a graph showing the experimental results of an exemplary embodiment.

An example of the present invention was prepared and tested as described above using metal body precursors A. The heat transfer coefficient versus heat flux for example 1 was measured with 3M NOVEC HFE-7000 as the working fluid is shown in FIG. 7.

It is to be understood that even in the numerous characteristics and advantages of the structured thermal transfer articles of the present disclosure set forth in the above description and examples, together with details of the structure and function of the structured thermal transfer articles, the disclosure is illustrative only. Changes can be made to detail, especially in matters of shape and size of the metal bodies and methods of use within the principles of the present disclosure to the full extent indicated by the meaning of the terms in which the appended claims are expressed and the equivalents of those structures and methods.

What is claimed is:

1. A structured thermal transfer article comprising:
   a plurality of metal bodies comprising an inner portion comprising a first metal selected from the group consisting of aluminum, copper, silver, and alloys thereof, and an outer portion comprising an alloy comprising the first metal and a second metal selected from the group consisting of copper, silver, and magnesium, wherein said first metal and said second metal are different; and a plurality of interstitial elements disposed between and connecting said plurality of metal bodies to one another, said interstitial elements comprising said alloy of said outer portion.

2. The structured thermal transfer article of claim 1 wherein said first metal comprises copper and said second metal comprises silver.

3. The structured thermal transfer article of claim 1 wherein said first metal is copper and said interstitial element comprises an alloy of silver and copper.

4. The structured thermal transfer article of claim 1 wherein said first metal comprises aluminum and said second metal comprises magnesium.

5. The structured thermal transfer article of claim 1 wherein said first metal is aluminum and said interstitial element comprises an alloy of aluminum and magnesium.

6. The structured thermal transfer article of claim 1 wherein said inner portion further comprises diamond.

7. The structured thermal transfer article of claim 6 wherein said diamond comprises an intermediate coating comprising a carbide former selected from the group consisting of chromium, cobalt, manganese, molybdenum, nickel, silicon, tantalum, titanium, tungsten, vanadium, zirconium, and alloys thereof, wherein said first metal is affixed to said intermediate coating.

8. The structured thermal transfer article of claim 1 wherein said plurality of metal bodies have a unit density in the range of $10^7$ to $10^9$ bodies per cubic centimeter.

9. The structured thermal transfer article of claim 1 wherein said metal bodies are substantially spherical.

10. The structured thermal transfer article of claim 9 wherein said metal bodies comprise an average diameter in the range of 5 to 50 micrometers.

11. The structured thermal transfer article of claim 1 wherein said metal bodies comprises an aspect ratio in the range of 1 to 2.

12. The structured thermal transfer article of claim 1 having a thickness in the range of 20 to 500 millimeters.

13. The structured thermal transfer article of claim 1 wherein said structured thermal transfer article has an effective porosity of at least 10 percent.

14. A structured thermal transfer article comprising:
a plurality of composite bodies comprises an inner portion comprising diamond and a first metal selected from the group consisting of aluminum, copper, silver, and alloys thereof, and an outer portion comprising an alloy comprising the first metal and a second metal selected from the group consisting of copper, silver, and magnesium, wherein said first metal and said second metal are different; and
a plurality of interstitial elements disposed between and connecting said plurality of metal bodies to one another, said interstitial elements comprising said alloy of said outer portion.

15. The structured thermal transfer article of claim 14 wherein said first metal comprises copper and said second metal comprises silver.

16. The structured thermal transfer article of claim 14 wherein said first metal is copper and said interstitial element comprises an alloy of silver and copper.

17. The structured thermal transfer article of claim 14 wherein said first metal comprises aluminum and said second metal comprises magnesium.

18. The structured thermal transfer article of claim 14 wherein said first metal is aluminum and said interstitial element comprises an alloy of aluminum and magnesium.

19. The thermal transfer coating of claim 14 further comprising an intermediate coating affixed to said diamond comprising a carbide former selected from the group consisting of chromium, cobalt, manganese, molybdenum, nickel, silicon, tantalum, titanium, tungsten, vanadium, zirconium, and alloys thereof, wherein said first metal is affixed to said intermediate coating.

20. The structured thermal transfer article of claim 14 wherein said plurality of metal bodies have a unit density in the range of $10^7$ to $10^9$ metal bodies per cubic centimeter.

21. The structured thermal transfer article of claim 14 wherein said metal bodies are substantially spherical.

22. The structured thermal transfer article of claim 14 wherein said metal bodies comprises an aspect ratio in the range of 1 to 2.

23. The structured thermal transfer article of claim 14 wherein said metal bodies comprise an average diameter in the range of 5 to 50 micrometers.

24. The structured thermal transfer article of claim 14 wherein said coating comprises a thickness in the range of 20 to 1,000 micrometers.

25. The structured thermal transfer article of claim 14 wherein said structured thermal transfer article has an effective porosity of at least 20 percent.

26. A cooling system comprising the structured thermal transfer article of claim 1.

27. A cooling system comprising the structured thermal transfer article of claim 14.

28. A method of cooling, a heat-dissipating device comprising:
providing a heat dissipating substrate having an outer surface;
affixing the structured thermal transfer article of claim 1 to said outer surface;
contacting said structured thermal transfer article with a cooling fluid.

29. The method of claim 28 wherein said method comprises single phase heat transfer.

30. The method of claim 28 wherein said method comprise two phase heat transfer.

31. The method of claim 30 wherein said cooling fluid is contained within a thermosyphon.

32. The method of claim 28 further comprising affixing said heat-dissipating substrate to a heat-generating device.

* * * * *